(12) United States Patent
Nakai (10) Patent No.: US 7,057,229 B2
(45) Date of Patent: Jun. 6, 2006

(54) NONVOLATILE MEMORY DEVICE FOR STORING MULTI-BIT DATA

(75) Inventor: Tsutomu Nakai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/341,424

(22) Filed: Jan. 14, 2003

(65) Prior Publication Data

US 2003/0104665 A1   Jun. 5, 2003

Related U.S. Application Data

(63) Continuation of application No. PCT/JP00/04801, filed on Jul. 17, 2000.

(51) Int. Cl.
  *H01L 29/788*   (2006.01)
(52) U.S. Cl. ................ 257/315; 257/316; 257/317
(58) Field of Classification Search ........ 257/314–317; 438/200–203
  See application file for complete search history.

(56) References Cited

U.S. PATENT DOCUMENTS 5,502,321 A * 3/1996 Matsushita ............... 257/316
6,121,655 A * 9/2000 Odanaka et al. .......... 257/315

FOREIGN PATENT DOCUMENTS

| EP | 0 847 091 A2 | 6/1998 |
| EP | 0 935 293 A2 | 8/1999 |
| JP | 8-172199 | 7/1996 |
| JP | 11-8325 | 1/1999 |
| JP | 11-238815 | 8/1999 |

OTHER PUBLICATIONS

Y. Hayashi et al., "Twin MONOS Cell with Dual Control Gates", 2000 IEEE, 2000 Symposium on VLSI Technology Digest of Technical Papers, pp. 122-123.

* cited by examiner

*Primary Examiner*—Hoai Pham
*Assistant Examiner*—Nathan W. Ha
(74) *Attorney, Agent, or Firm*—Westerman, Hattori, Daniels & Adrian, LLP (57) ABSTRACT

A semiconductor nonvolatile memory device for storing multi-bit data has a memory cell having a source region S and a drain region D formed at the surface of a semiconductor substrate, a gate insulator film and a control gate CG formed on a channel region CH between the source region S and the drain region D and a nonconductive trap gate in the gate insulator film. An indentation 4 is provided at the surface of the semiconductor substrate covering a region from a position in the vicinity of the drain region to the drain region. By providing the indentation 4 on the drain region side of the channel region, the trap gate is positioned in the direction of a channel current flowing from the source region S to the drain region D. Then, the a charge having run through the channel region CH is injected efficiently into the trap gate on the indentation.

7 Claims, 8 Drawing Sheets

NONVOLATILE MEMORY DEVICE FOR STORING MULTI-BIT DATA

This application is a continuation of International Application PCT/JP00/04801 filed Jul. 17, 2000.

TECHNICAL FIELD

The present invention relates generally to a semiconductor nonvolatile memory and, more particularly, to a novel structure of a nonvolatile memory device into which multi-bit data can be written and whose power voltage can be lowered, and to a method of manufacturing the same.

BACKGROUND ART

Semiconductor nonvolatile memories comprised of memory cells each having a floating gate are in wide use as flash memories or nonvolatile memories. Such memories are used in digital cameras, portable information terminals and portable phones etc. because the recorded data in such memories are still maintained after the power has been turned off. Because of such uses, a larger capacity and a lower power voltage is demanded to nonvolatile memories.

As for the demand for a larger capacity, it has been proposed that not a one (1)-bit data but a multi-bit data is recorded in one (1) memory cell. Generally, storing multi-bit in a memory cell structure having floating gate is realized by maintaining a plurality of threshold voltage conditions in a memory cell. However, the operation of the memory under a low power voltage becomes difficult when a plurality of threshold voltage conditions are set.

On the other hand, as means for storing multi-bit, a nonvolatile memory of, for example, MONOS structure has been proposed. In this MONOS structure memory cell, data is recorded by varying a threshold voltage by making a trap gate consisting of a nitride film formed within the gate oxide film trap a charge. Because the trap gate is nonconductive, a charge can be trapped locally in the trap gate. Therefore, storage of binary data becomes possible by letting the charge trapped at a source side and a drain side of the trap gate. However, also in the memory cell of such a structure, it is desired to meet the requirement of a lower power voltage by lowering the injection voltage when the charge is injected.

It is therefore the object of the present invention to provide a semiconductor nonvolatile memory device allowing the writing voltage to be lowered and capable of storing multi-bit data, and to provide a method of manufacturing the same.

DISCLOSURE OF THE INVENTION

In order to achieve the above object, according to a first aspect of the present invention there is provided a semiconductor nonvolatile memory device for storing multi-bit data, comprising a memory cell, the memory cell including a source region and a drain region which are formed at the surface of a semiconductor substrate; a gate insulator film and a control gate which are formed on a channel region between the source region and the drain region; and a nonconductive trap gate in the gate insulator film, wherein the memory cell has, at the surface of the semiconductor substrate, an indentation extending from a position in the vicinity of the drain region in the channel region to the drain region.

The trap gate is positioned in the direction of a channel current flowing from the source region toward the drain region by providing the indentation at the drain region side in the channel region. Therefore, charges running through the channel region are injected efficiently into the trap gate on the indentation. Therefore, hot charges can be injected into the trap gate without applying a high voltage to the control gate, etc.

According to a second aspect of the present invention there is provided a semiconductor nonvolatile memory device for storing multi-bit data, comprising a memory cell, the memory cell including a source region and a drain region which are formed at the surface of a semiconductor substrate; a gate insulator film and a control gate which are formed on a channel region between the source region and the drain region; and a nonconductive trap gate in the gate insulator film, wherein the memory cell has, in a first region which is a part along the gate width, a first indentation extending from a position in the vicinity of the drain region in the channel region to the drain region, and wherein the memory cell has, in a second region which is a part along the gate width, different from the first region, a second indentation extending from a position in the vicinity of the source region in the channel region to the source region.

Recording of multi-bit data becomes possible by recording a first bit data by injecting a charge into a trap gate on a first indentation and by recording a second bit data by injecting a charge into a trap gate on a second indentation. Furthermore, charge injection can be conducted efficiently because the trap gates are provided on the first and the second indentations and in the direction of the channel current.

In a preferred embodiment associated with the second aspect, in the channel region in the vicinity of the drain region, the threshold voltage in a region other than the first region is higher than the threshold voltage in the first region for the case where no charges are trapped, and in the channel region in the vicinity of the source region, the threshold voltage in a region other than the second region is higher than the threshold voltage in the second region for the case where no charges are trapped.

In another preferred embodiment associated with the second aspect, the first indentation and the second indentation are formed at the both side of the diagonal of the channel region. The state in which charges are trapped in the trap region on each indentation can be detected separately in the two regions of the channel region by forming the two indentations on the diagonal of the channel region.

In a further preferred embodiment associated with the second aspect, a plurality of memory cell are provided adjacent to each other, the source region and the drain region being shared by the adjacent memory cells, the first and the second indentations being shared by the adjacent memory cells. Since the first and the second indentations can be shared by adjacent memory cells, the pattern size of the mask for forming the indentations can be made approximately the same size as the gate length, reducing the manufacturing cost.

According to a third aspect of the present invention there is provided a method of manufacturing a semiconductor nonvolatile memory device for storing multi-bit data, the method comprising the steps of:

forming indentation at a surface of a semiconductor substrate having a first conducting type;

forming a gate insulator film and a control gate on a horizontal surface of the semiconductor substrate and on the surface of the indentation, the gate insulator film embedding a nonconductive trap gate therein;

forming a source region of a second conducting type opposite to the first conducting type at the horizontal surface of the semiconductor substrate and a drain region of the second conducting type at the bottom surface of the indentation using the control gate as a mask.

In accordance with the above manufacturing method, a horizontal channel and a vertical channel can be formed respectively at the source region side and the drain region side in a nonvolatile memory device having nonconductive trap gates. Therefore, a memory device can be manufactured which allows charges with high energy running through a channel in the vertical channel region to efficiently be injected into a trap gate.

BRIEF DESCRIPTION OF DRAWINGS

FIGS. 8A–8D shows the extension of the depletion layer of the memory cell shown in FIGS. 2 and 7.

BEST MODE FOR CARRYING OUT THE INVENTION

Figure 1:
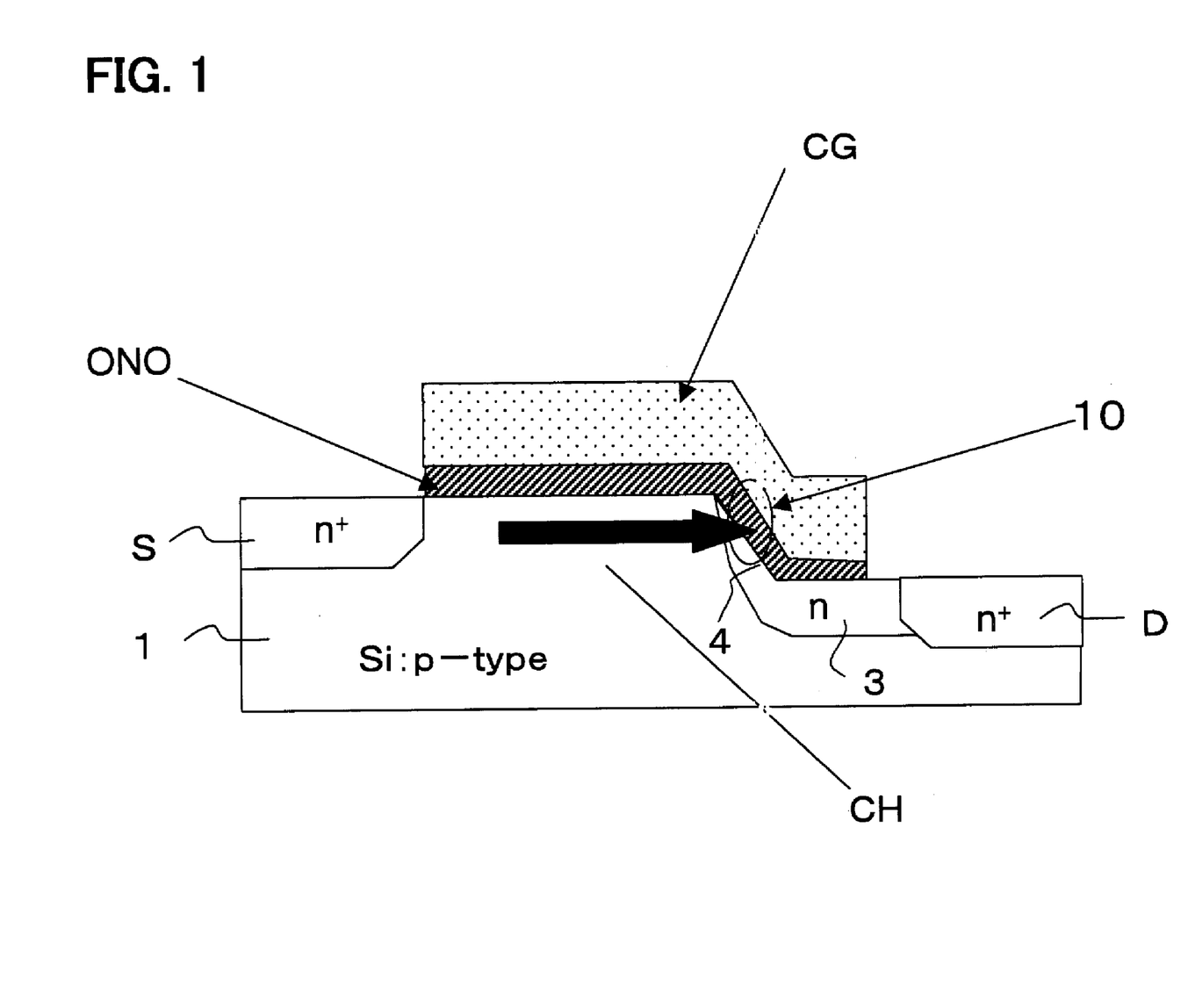
FIG. 1 is a cross-sectional view illustrating the cell structure of a semiconductor memory device of an embodiment.

Preferred embodiments of the present invention will now be described with reference to the drawings. FIG. 1 is a cross-sectional view illustrating the cell structure of a semiconductor memory device of the embodiment. In this memory cell, an n-type source region S and an n-type drain region D are formed at the surface of a p-type silicon semiconductor substrate 1 and a three-layer structure ONO consisting of a gate oxide film/silicon nitride film/gate oxide film is provided on a channel region CH between the source region S and the drain region D. Furthermore, a control gate CG made from polysilicon is provided on the ONO. The silicon nitride in the middle of the three-layer structure ONO is a trap gate formed surrounded by the gate oxide films.

The characteristic configuration of the embodiment is that an indentation 4 is formed at the substrate surface from the vicinity of the drain region D to the drain region D. Therefore, a channel is constituted by a horizontal channel region in the vicinity of the source region S and by a vertical channel region in a region on a slope 10 in the vicinity of the drain region D, and the drain region D is formed in the bottom portion of the indentation 4. In addition, along the indentation 4, an n-type doped region 3 having a lower concentration than that of the drain region D is provided extending from the drain region D to the channel region CH.

In this memory cell structure, when the source region S is grounded, a positive voltage is applied to the drain region D and a predetermined positive voltage is applied to the control gate CG, electrons are induced into the channel region CH by the control gate voltage resulting in forming a channel and the electrons run in the direction denoted by the arrow from the source region S along the horizontal channel region CH. These electrons flow along the interface between the surface of the substrate 1 and the gate oxide film and become hot electrons in the vicinity of the drain D. Then, because the indentation 4 is provided in the vicinity of the drain, the trap gate of three-layer structure ONO exists at a position on the slope 10 (the vertical channel) in the indentation 4 such that it opposes the direction of the channel electrons.

That is, the hot electrons having run through the horizontal channel region are accelerated in the direction from the position at the slope 10 to the trap gate by an electric field between the source and the drain, injected and trapped in the trap gate. In a conventional MONOS structure cell, hot electrons having run through a horizontal channel are pulled in the vicinity of the drain and trapped by a vertical electric field generated by a control gate voltage. In contrast, in this embodiment, because the trap gate is provided in the direction of the move of the hot electrons having run through the horizontal channel, a higher injection efficiency of the hot electrons into the trap gate can be obtained. Furthermore, because the electric field between the source and the drain contributes the injection of the hot electrons, it is possible to lower the voltage necessary for programming. Alternatively, it is possible to inject in a shorter time.

A cell transistor shown in FIG. 1 has an n-type region 3 having a lower concentration at the channel region CH side of the drain region D. It is so-called LDD (Light Doped Drain) structure. By being structured as the LDD structure, the lower concentration region 3 can be formed along the slope 10 (the vertical channel) of the indentation 4. Therefore, the depletion layer formed between the n-type drain region D and the p-type substrate 1 can be formed such that the depletion layer extends in the direction from the slope of the indentation 4 to the channel region CH (the direction toward left in FIG. 1). As a result, the direction of an electric field generated in the depletion layer between the lower concentration region 3 in the vicinity of the vertical channel and the channel region CH becomes same as the direction of the channel electrons denoted by the arrow. Thus, the above electric field, with the electric field generated by a gate voltage applied to the control gate CG, assists the attraction of the hot electrons to the trap gate. Therefore, the injection efficiency of the hot electrons can be further made higher by providing a lower concentration region 3 on the slope 10. The above-described extension of the depletion layer will be discussed later referring to FIG. 8.

Figure 2:
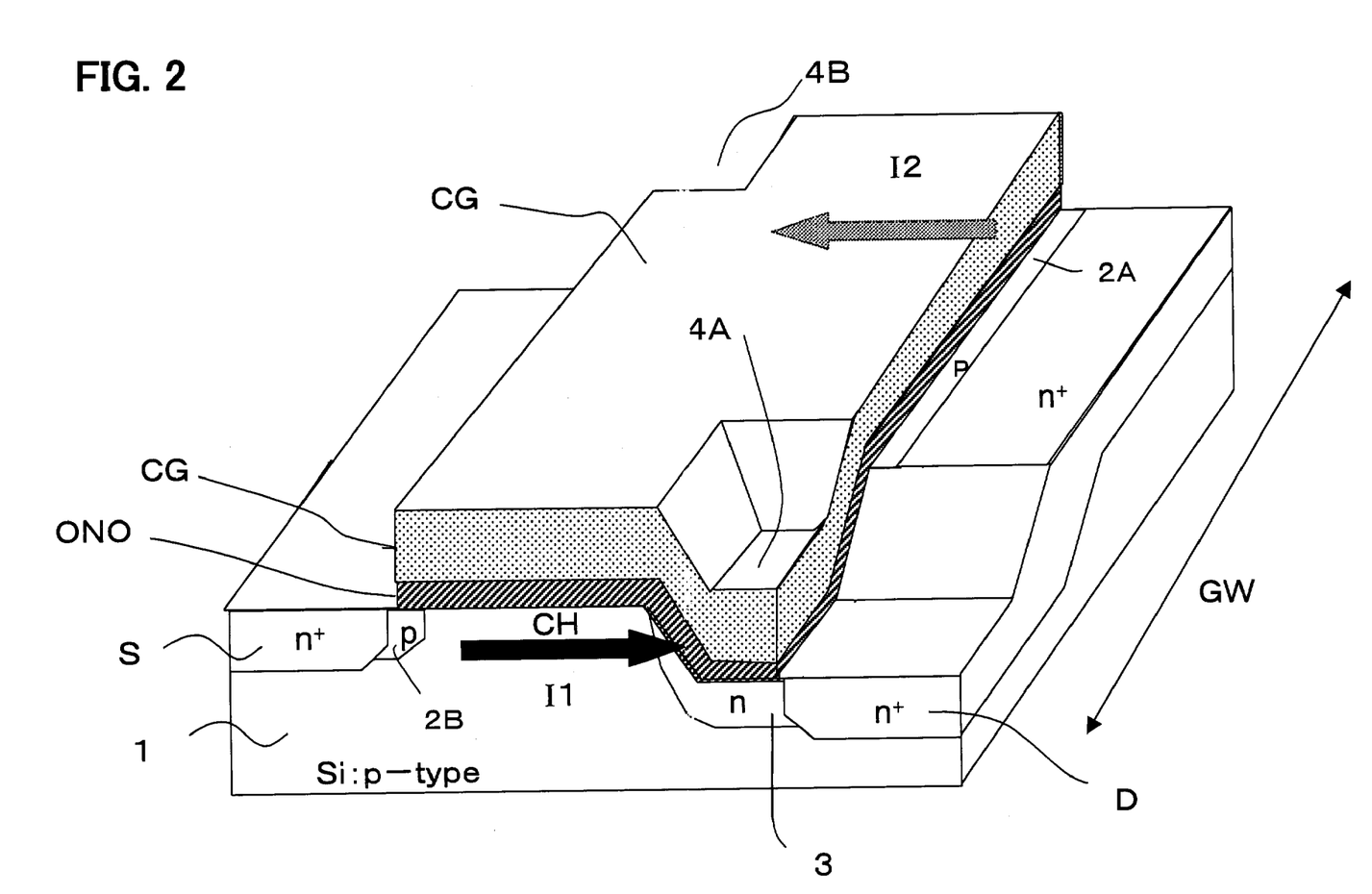
FIG. 2 is a perspective view of a memory cell capable of storing multi-bit data in the embodiment.

FIG. 2 shows a perspective view of a memory cell capable of storing multi-bit data. The memory cell shown in FIG. 2 has indentations 4A and 4B formed at two (2) positions on the diagonal of a rectangular-shaped channel region. That is, the indentation 4A at the lower side in FIG. 2 is provided in a portion at the lower side of a gate width GW in the vicinity of the drain region D of the channel region CH. The indentation 4B at the upper side is provided in a portion on the upper side of the gate width GW in the vicinity of the source region S of the channel region CH. In addition, a p-type region 2A for raising the threshold voltage is formed between the drain region D and the channel region CH in the region except the indentation 4A, and extends in the direction toward the gate width GW. Similarly, a p-type region 2B is formed between the source region S and the channel region CH in the region except the indentation 4B and extends in the direction toward the gate width GW.

With these p-type regions 2A and 2B formed as above, the half of the channel region at the lower side of the gate width GW is utilized for trapping a charge at the trap gate on the first indentation 4A and for detecting if the trapping exists or not. Similarly, the half of the channel region at the upper side of the gate width GW is utilized for trapping a charge at the trap gate on the second indentation 4B and for detecting if the trapping exists or not. Therefore, in the channel region CH in the vicinity of the drain region D, the threshold voltage in the region except the first region 4A is formed higher than the threshold in the first region 4A for the case where no charge is trapped and, furthermore, in the channel region CH in the vicinity of the source region S, the threshold voltage in the region except the second region 4B is formed higher than the threshold in the second region 4B for the case where no charge is trapped.

Hot electrons I1 having run through the horizontal channel strike the indentation 4A and are injected into the trap gate on the indentation 4A. Hot electrons I2 having run in the opposite direction strike the indentation 4B and are injected into the trap gate on the indentation 4B. Therefore, in one memory cell, regions for trapping charges are formed at two positions 4A, 4B and recording of 2 bits data becomes possible.

Because the p-type regions 2A and 2B are provided respectively between the drain region except the indentations 4A and the channel region CH, and between the source region S except 4B and the channel region CH, and the threshold voltages are being raised in those p-type regions 2A and 2B, the read-out operation is conducted separately for each of the lower side and the upper side of the channel region CH. For example, when the lower side of the channel region CH is used, a ground potential is applied to the drain region D, a positive potential is applied to the source region S and a predetermined read-out voltage is applied to the control gate CG. Then, a current flows from the source region S to the drain region D via the region of indentation 4A if no electron is being trapped in the trap gate of the indentation 4A. In contrast, no current flows if electrons are being trapped since the threshold voltage over the entire channel region in the vicinity of the drain region D becomes higher because of the trapped electrons at the region of indentation 4A and the p-type region 2A.

When the upper side of the channel region CH is used, a ground potential is applied to the source region S, a positive potential is applied to the drain region D and a predetermined read-out voltage is applied to the control gate CG. As a result, whether a channel current is generated or not depends on if electrons are trapped in the trap gate on the indentation 4B or not.

As described above, in the memory cell in FIG. 2, the trap gate consisting of a silicon nitride film is formed by providing two indentations 4A and 4B within the channel region. Because of such a structure, the hot electrons denoted by the arrow I1 can be efficiently injected into the trap gate on the indentation 4A, at the lower side of the channel region CH. Furthermore, the hot electrons denoted by the arrow I2 can be efficiently injected into the trap gate on the indentation 4B, at the upper side of the channel region CH. Therefore, a memory cell for storing 2 bits data with a low voltage power source can be realized.

FIGS. 3 and 4 illustrate the process of the manufacturing method of the memory cell shown in FIG. 2. As shown in FIG. 3A, a mask 24 for defining the region to form the indentations 4A and 4B is formed after a silicon oxide film 20 and a silicon nitride film 22 are formed on the surface of the p-type silicon semiconductor substrate 1. Then, the silicon nitride film 22 on the region for forming the indentation is etched off utilizing this mask film 24. As shown in FIG. 3B, a low concentration n-type region 26 is formed at the surface of the substrate 1 by ion implantation of an n-type dopant such as phosphorus using the patterned silicon nitride film 22 as the mask.

Figure 3A:
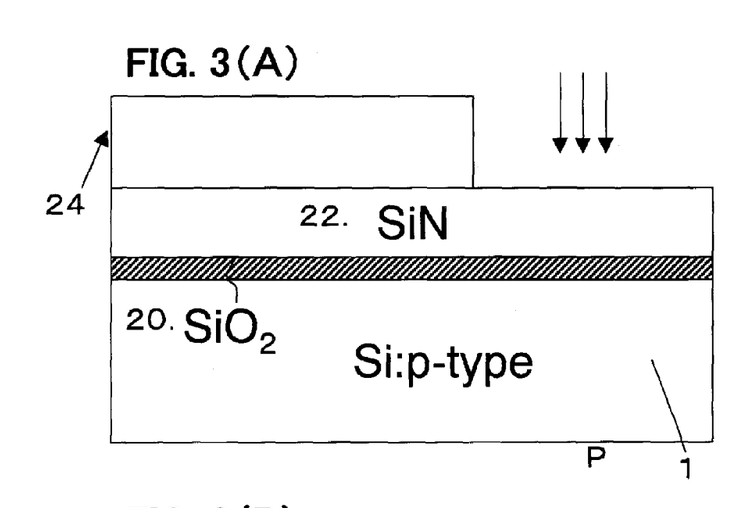
FIGS. 3A–3D illustrates the process of the manufacturing method of the memory cell shown in FIG. 2.
Figure 3B:
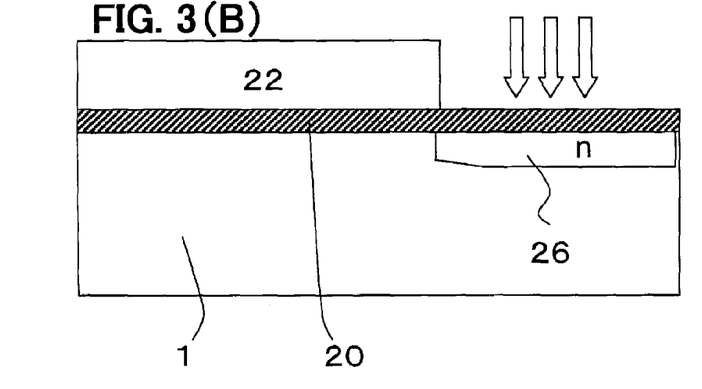
Figure 3C:
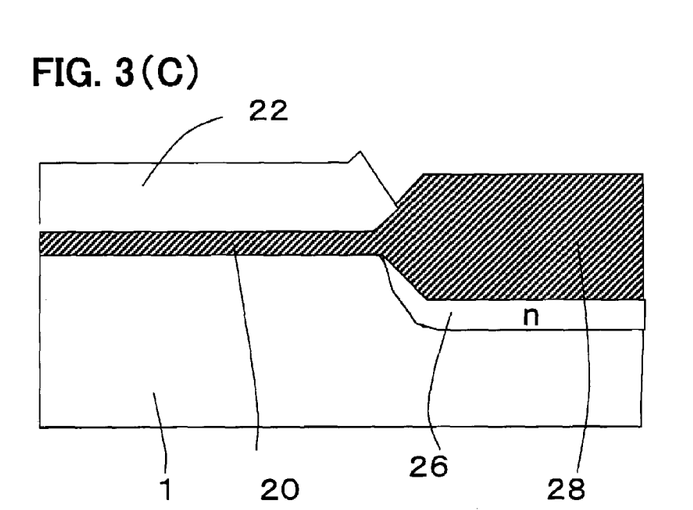
Figure 3D:
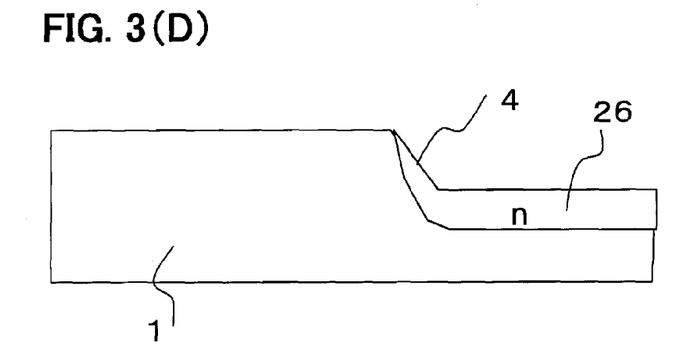

As shown in FIG. 3C, a thick silicon oxide film 28 is formed in a thermal oxidation atmosphere in the region where an indentation has been formed. Then, as shown in FIG. 3D, the silicon nitride film 22 and the silicon oxide films 20 and 28 are removed. Consequently, the indentation 4 is formed at the surface of the substrate 1 and an n-type region 26 is formed in a region covering from the slope to the bottom of the indentation 4A.

Figure 4A:
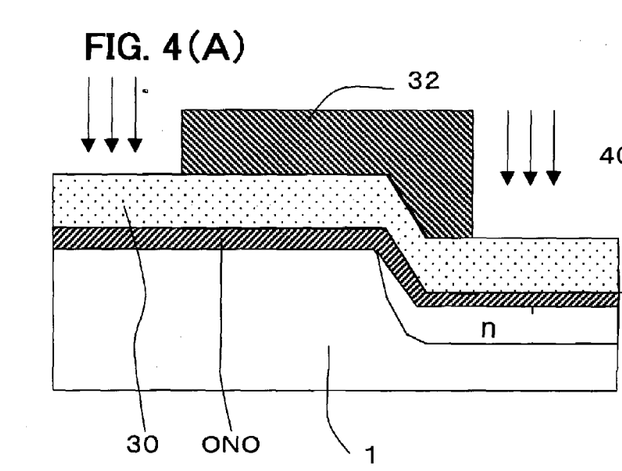
FIGS. 4A–4D illustrates the process of the manufacturing method of the memory cell shown in FIG. 2.
Figure 4B:
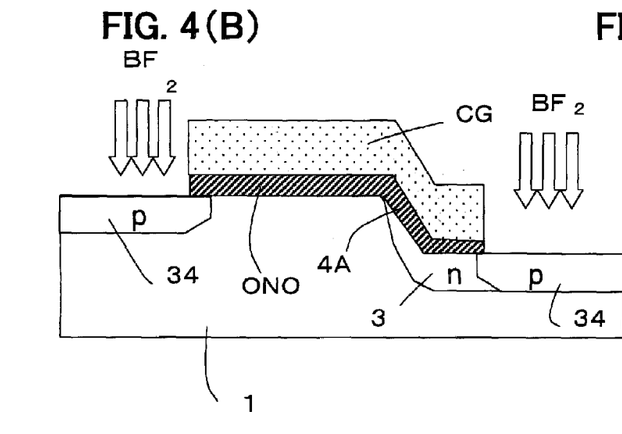

Then, as shown in FIG. 4A, a three-layer structure ONO consisting of a silicon oxide film, a silicon nitride film and a silicon oxide film is formed on the surface of the substrate and a polysilicon layer 30 is further formed on the three-layer structure ONO. Then, the polysilicon layer 30 and the three-layer structure ONO are removed by etching utilizing a mask 32 defining a region for forming the control gate CG. As a result, as shown in FIG. 4B, the three-layer structure ONO and the control gate CG are formed in the region covering from the horizontal surface of the substrate 1 to the slope of the indentation 4A. Then, a p-type region 34 is formed by ion implantation of boron fluoride $BF_2$ using the control gate CG as the mask. This p-type region 34 is the p-type regions 2A and 2B that raise the threshold voltage.

Figure 4C:
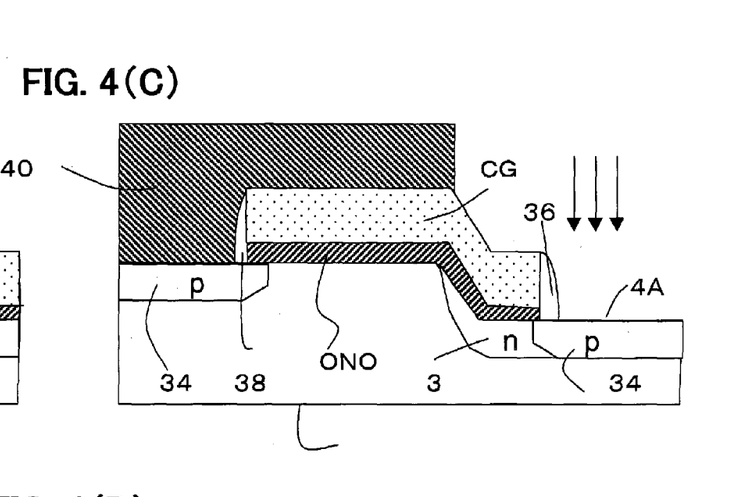
Figure 4D:
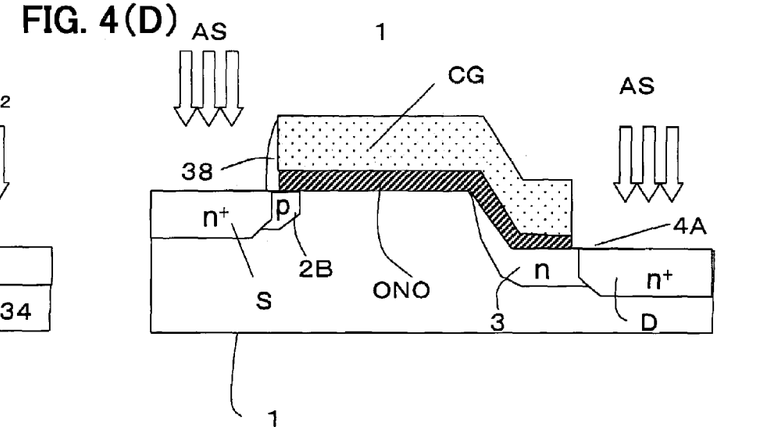

Then, as shown in FIG. 4C, side walls 36 and 38 are formed on both sides of the control gate CG and the three-layer structure ONO. Then, the side wall 36 in the region of the indentation 4 (the region of 4A and 4B not shown) is removed by etching using a mask 40. Then, as shown in FIG. 4D, an n-type dopant such as arsenic is ion-implanted using the control gate and the side wall 38 as the masks. As a result, the n-type source region S and the drain region D having high concentrations are formed. Because of the side wall 38, the p-type region 2B on the source region side is remained and the p-type region 34 within the indentation 4A is lost. However, as shown in FIG. 2, in the region except the indentation 4A in the drain region D, the p-type region 2A is remained in the region bordering the channel region.

As described above, the memory cell in the embodiment can be formed in the common semiconductor process.

Figure 5:
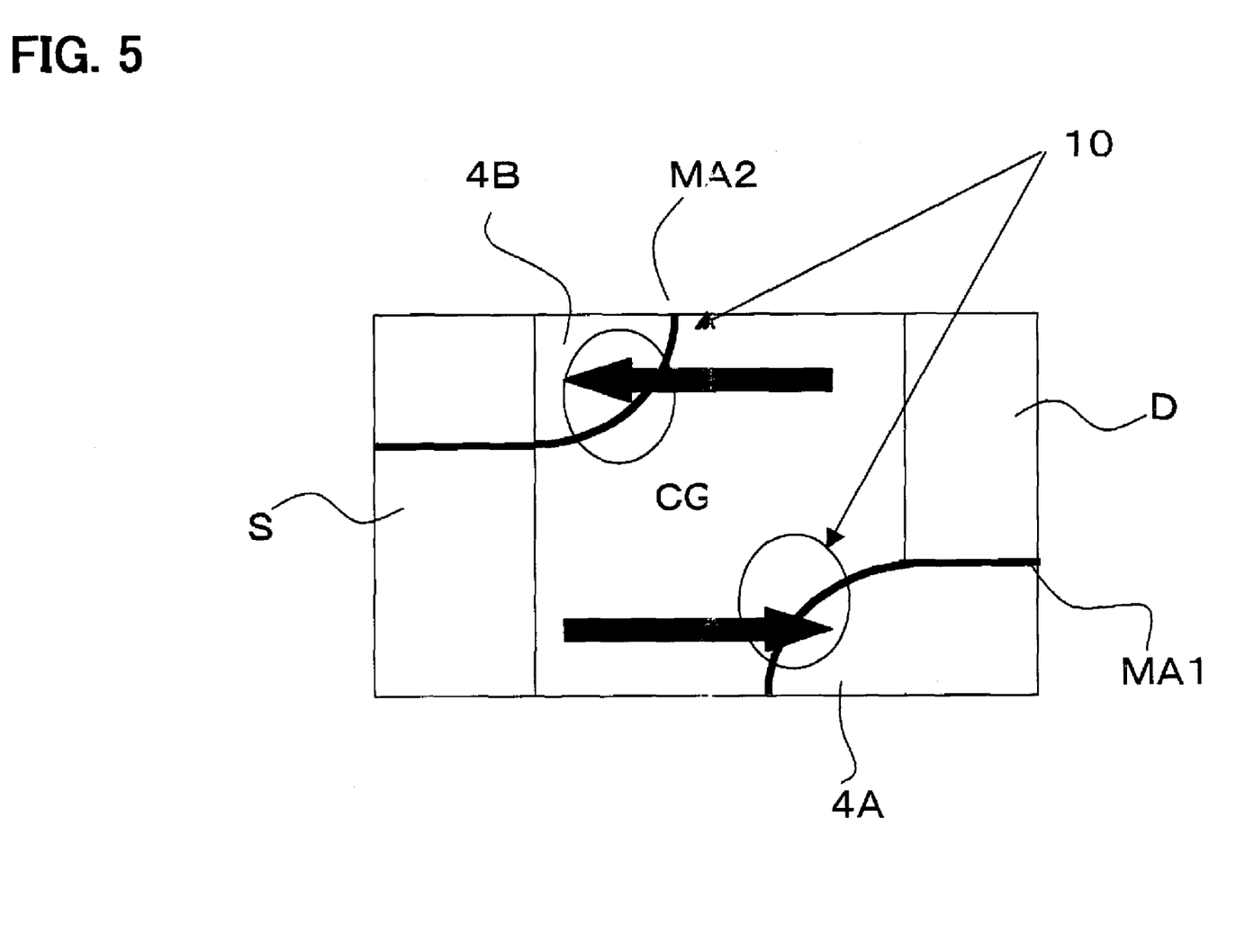
FIG. 5 is a plan view of a memory cell.

FIG. 5 is a plan view of one memory cell. The source region S and the drain region D are formed on both of the sides of the control gate CG. Then, two mask patterns MA1 and MA2 are used to form the indentations 4A and 4B. Then, hot electrons run in the direction denoted by arrows respectively and are injected at the vertical channel regions 10 into the trap gates under the control gate CG.

As apparent from the plan view of FIG. 5, the size of the mask patterns MA1 and MA2 are one forth (¼) of the size of a cell region constituted by the control gate CG and the source and the drain regions S and D, or smaller. However, it is not preferable to use such small-sized masks in terms of process precision.

Figure 6:
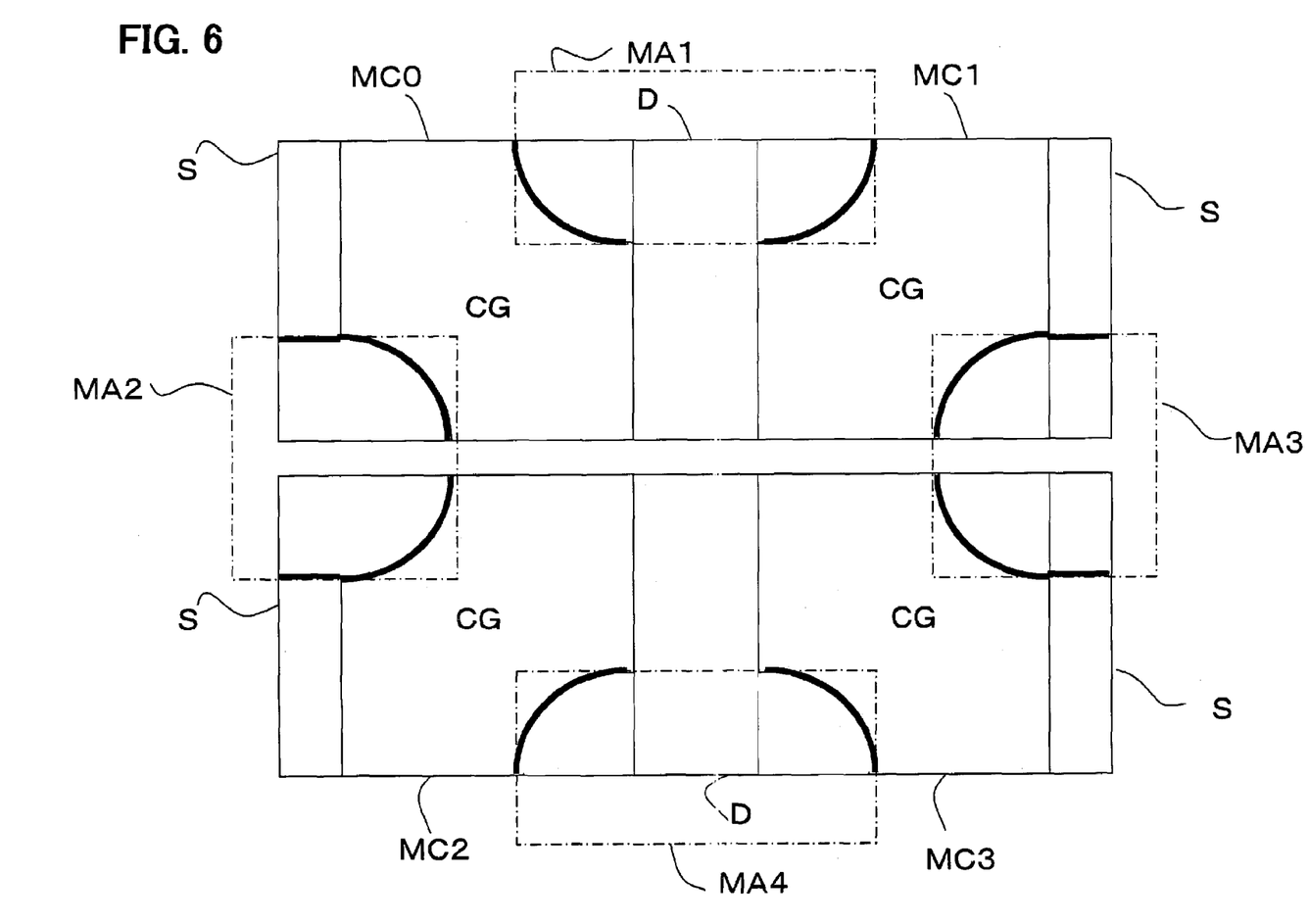
FIG. 6 is a plan view of four memory cells.

FIG. 6 is a plan view of four memory cells. In FIG. 6, four memory cells MC0–MC3 are provided adjacent to each other. Then, the memory cells MC0 and MC1 share the drain region D and the memory cells MC2 and MC3 also share the drain region D. In addition, the memory cells can share the source region S respectively with other four cells (not shown). By arranging the four memory cells adjacent to each other, the mask pattern MA1 for forming the indentation can be shared between the memory cell MC0 and MC1 adjacent to each other. Similarly, the mask pattern MA2 can be shared between the memory cell MC0 and MC2 adjacent to each other. Furthermore, mask patterns MA3 and MA4 can be also shared between memory cells adjacent to each other.

The size of these shared mask patterns MA1–MA4 is larger compared to that in the case shown in FIG. 5. Therefore, the problem of low precision in the manufacturing process can be avoided. As shown in FIG. 6, the size of mask patterns MA1–MA4 is approximately same as the size of one memory cell. By arranging the size of the mask patterns as shown in FIG. 6, a plurality of memory cells can be positioned in an efficient arrangement and indentations can be formed utilizing the masks which are relatively large compared to those memory cells.

Figure 7:
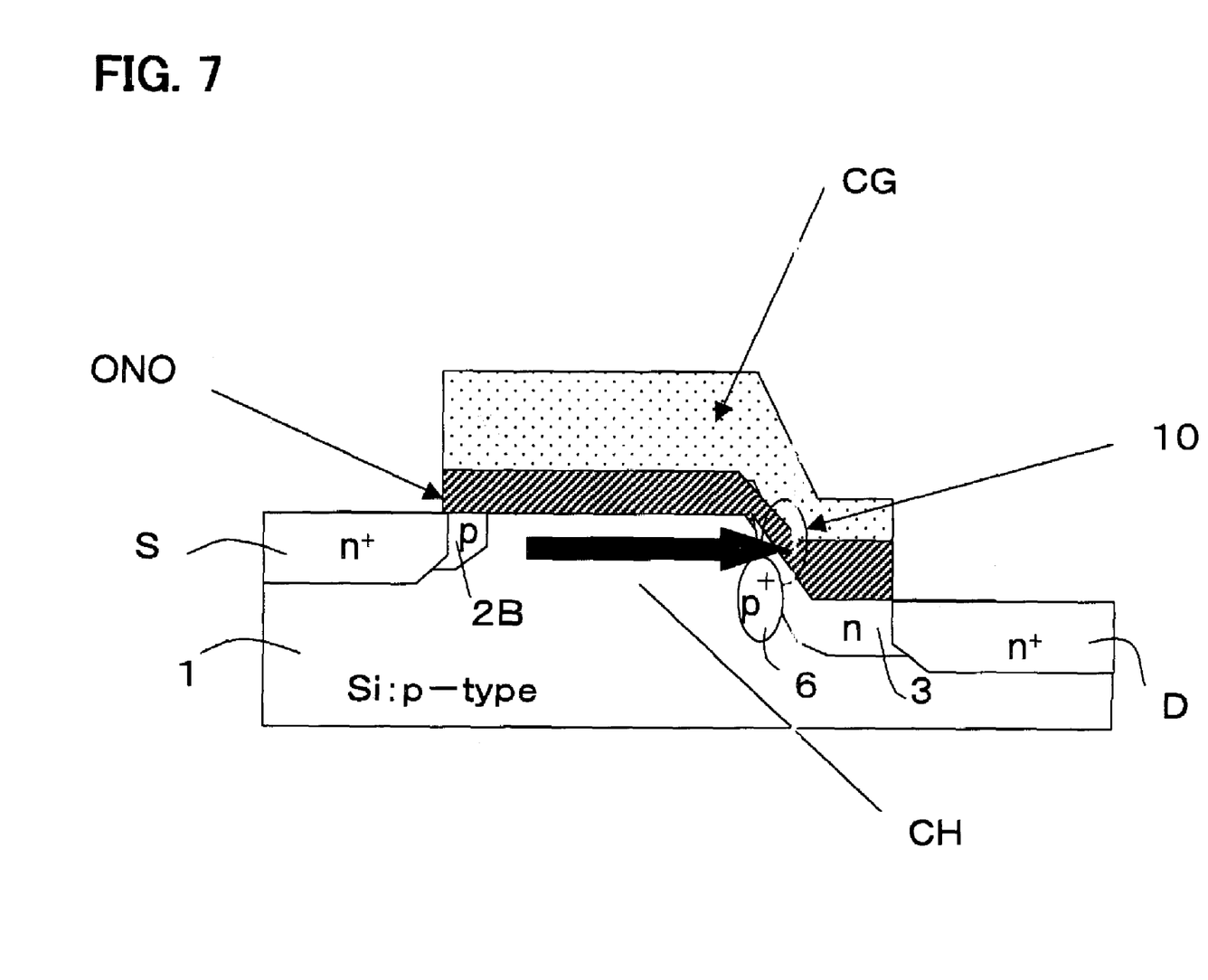
FIG. 7 is a cross-sectional view illustrating a memory cell of an improved embodiment.

FIG. 7 is a cross-sectional view illustrating a memory cell improved from the embodiment shown in FIG. 2. The memory cell shown in FIG. 7 has a p-type region 6 having a relatively high concentration, provided between the low concentration n-type region 3 formed at the slope (the vertical channel region) in the indentation of the drain region, and the channel region CH. By providing this p-type region 6, the width of the depletion layer in the vertical channel region becomes narrow, the electric field becomes concentrated more, and the hot electrons running in the direction denoted by the arrow are accelerated more and are injected more efficiently to the trap gate on the vertical channel region.

Figure 8A:
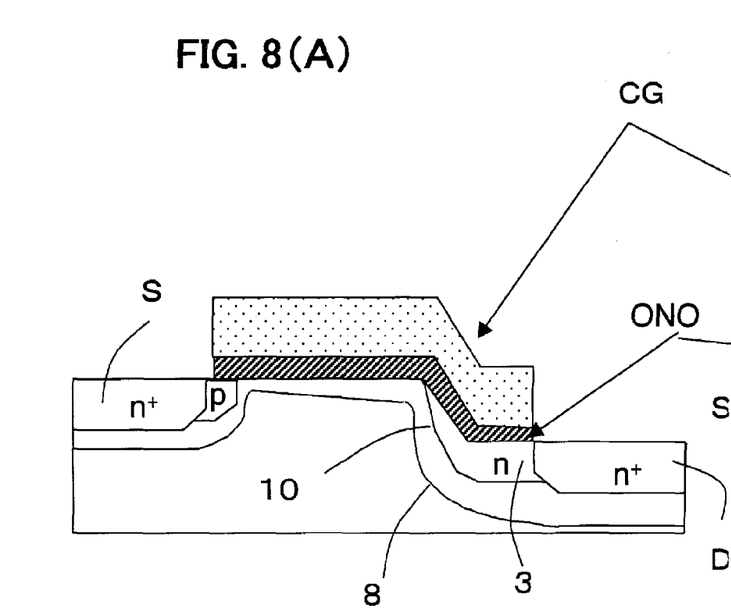

FIG. 8 shows the extension of the depletion layer of the memory cell shown in FIG. 2 and FIG. 7. FIG. 8A shows the extension of the depletion layer 8 of the memory cell shown in FIG. 2. Because the n-type low concentration region 3 is formed in the vertical channel region where the indentation at the drain region side is formed, the depletion layer 8 extends laterally in the vertical channel region 10. Consequently, in the vertical channel region 10, the direction of the electric field generated by the depletion layer 8 is directed from the vertical channel region to the trap gate of three-layer structure ONO.

Figure 8B:
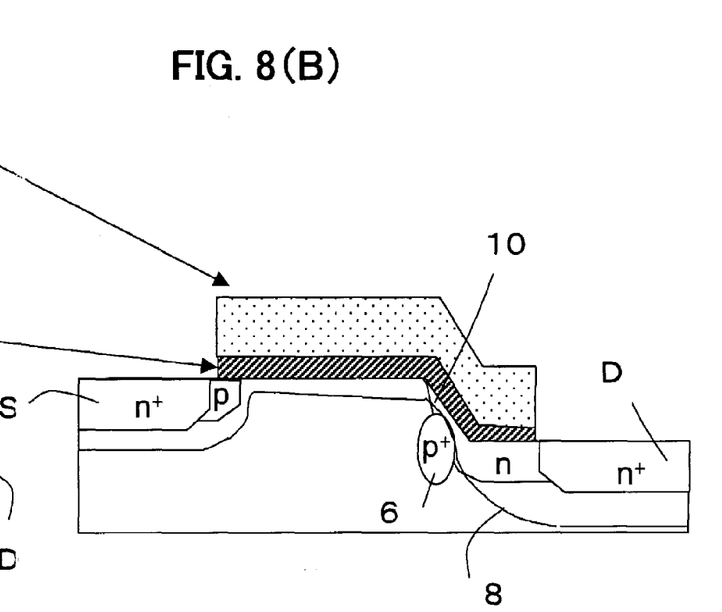

FIG. 8B shows the depletion layer 8 for the case where the p-type region 6 is provided in the vertical channel region 10. By providing the p-type region 6, the extension of the depletion layer 8 becomes smaller and the concentration of the electric field in the vertical channel region 10 becomes higher. Therefore, the electric field in the direction from the vertical channel region 10 to the trap gate of three-layer structure ONO becomes stronger and the injection efficiency of the hot electrons to the trap gate becomes higher.

As stated above, the nonvolatile memory of the embodiment employs a MONOS structure and the periphery of the drain region of the channel region is structured in a vertical channel structure. Therefore, hot electrons running through the horizontal channel region are injected and trapped efficiently to the trap gate formed from a silicon nitride film on the vertical channel region. It is thus possible to lower the voltage needed for programming and to provide a multi-bit nonvolatile memory device whose power voltage is lowered.

INDUSTRIAL APPLICABILITY

As described above, according to the present invention, the efficiency of injection of the hot electrons into the trap gate can be made higher by employing a vertical channel structure in the vicinity of the drain region of the channel region. As a result, a nonvolatile memory device can be provided which allows recording of multi-bit data and lowering of the power voltage.

What is claimed is:

1. A semiconductor nonvolatile memory device for storing multi-bit data, comprising:
   a memory cell, the memory cell including:
   a source region and a drain region which are formed at a surface of a semiconductor substrate;
   a gate insulator film and a control gate which are formed on a channel region between the source region and the drain region; and
   a nonconductive trap gate in the gate insulator film;
   wherein the memory cell has, at the surface of the semiconductor substrate, an indentation portion extending from a position in the vicinity of the drain region in the channel region to the drain region,
   wherein charges are trapped to the trap gate on the indentation portion, and
   wherein a region of a type opposite to the source region is formed between the source region and the channel region, and the region of a type opposite to the source region extends to the indentation portion and is not formed between the source region and channel region in the indentation portion.

2. A semiconductor nonvolatile memory device for storing multi-bit data, comprising:
   a memory cell, the memory cell including:
   a source region and a drain region which are formed at a surface of a semiconductor substrate;
   a gate insulator film and a control gate which are formed on a channel region between the source region and the drain region; and
   a nonconductive trap gate in the gate insulator film;
   wherein the memory cell has, in a first region which is a part along the gate width, a first indentation extending from a position in the vicinity of the drain region of the channel region to the drain region, and
   wherein the memory cell has, in a second region which is a part along the gate width, different from the first region, a second indentation extending from a position in the vicinity of the source region of the channel region to the source region, and
   wherein charges are trapped separately to the trap gate on the first indentation and to the trap gate on the second indentation.

3. The semiconductor nonvolatile memory device according to claim 2, wherein in the channel region in the vicinity of the drain region, the threshold voltage in a region other than the first region along the gate width is higher than the threshold voltage in the first region for the case where no charges are trapped, and wherein in the channel region in the vicinity of the source region, the threshold voltage in a region other than the second region along the gate width is higher than the threshold voltage in the second region for the case where no charges are trapped.

4. The semiconductor nonvolatile memory device according to claim 2, wherein the first indentation and the second indentation are formed at both sides on the diagonal of the channel region.

5. The semiconductor nonvolatile memory device according to claim 4, wherein a plurality of memory cell are provided adjacent to each other, the source region and the drain region being shared by the adjacent memory cells, the first and the second indentations being shared by the adjacent memory cells.

6. The semiconductor nonvolatile memory device according to claim 1 or 2, further comprising a lightly doped drain region extending from the drain region to the channel region in the indentation, the lightly doped drain region having the same conducting type as the drain region and having a lower concentration than the drain region.

7. The semiconductor nonvolatile memory device according to claim 6, further comprising, between the lightly doped drain region and the channel region, a region having the same conducting type as the channel region and having a higher concentration than the channel region.

* * * * *